United States Patent
Chapnik et al.

[11] Patent Number: 5,990,498
[45] Date of Patent: Nov. 23, 1999

[54] LIGHT-EMITTING DIODE HAVING UNIFORM IRRADIANCE DISTRIBUTION

[75] Inventors: Philip D. Chapnik, Newton; Bruce K. Johnson, North Andover, both of Mass.

[73] Assignee: Polaroid Corporation, Cambridge, Mass.

[21] Appl. No.: 08/931,252

[22] Filed: Sep. 16, 1997

[51] Int. Cl.⁶ .................................................. H01L 33/00
[52] U.S. Cl. ............................... 257/99; 257/91; 257/98
[58] Field of Search .................... 257/91, 98, 99

[56] References Cited

U.S. PATENT DOCUMENTS

| | | | |
|---|---|---|---|
| 4,495,514 | 1/1985 | Lawrence et al. | 357/67 |
| 5,134,340 | 7/1992 | Haitz | 313/500 |
| 5,656,823 | 8/1997 | Kruangam | 257/98 |
| 5,663,573 | 9/1997 | Epstein et al. | 257/99 |
| 5,739,545 | 4/1998 | Guha et al. | 257/103 |

FOREIGN PATENT DOCUMENTS

| | | |
|---|---|---|
| 0 741 419 A2 | 11/1996 | European Pat. Off. |
| 195 27 026 | 2/1997 | Germany. |
| 4-038881 | 2/1992 | Japan. |
| 2 064 865 | 6/1981 | United Kingdom. |

OTHER PUBLICATIONS

Patent Abstracts of Japan vol. 016, No. 224(E–1206) May 25, 1992.

*Primary Examiner*—Minh Loan Tran
*Attorney, Agent, or Firm*—Robert J. Decker; Joseph Stecewycz

[57] ABSTRACT

An illumination device configured so as to produce a uniform illumination distribution incorporating one or more LEDs fabricated such that the top surface emitting the colored light is not obstructed by an electrode or by contacts connecting the LED to a current source. Such a configuration is accomplished by providing a substantially transparent attachment layer that may include an opaque conductive material, but preferably includes transparent conductive particles that, in combination, attach and electrically connect the LED to an electrode disposed upon a substrate.

23 Claims, 7 Drawing Sheets

LIGHT-EMITTING DIODE HAVING UNIFORM IRRADIANCE DISTRIBUTION

BACKGROUND OF THE INVENTION

1. Field Of the Invention

This invention relates to a light-emitting diode, such as may be used as a source of optical radiation in a printer or a display, and in particular, to such a source fabricated so as to decrease the effects of a non-uniform distribution of radiation.

2. Description Of The Prior Art

One shortcoming to the use of light-emitting diodes (LEDs) as light sources is the inherent irradiance problems resulting from the configuration of electrical contacts at the LED, as shown in FIG. 1A. LED 12 is a two-terminal semiconductor device characterized primarily by its ability to pass current readily in only one direction. Current flow is achieved by creating an electrical barrier within the semiconductor or at the surface of the semiconductor. Passage of the current is allowed when the electrical barrier is reduced by applying a "forward" voltage, but current is blocked when the electrical barrier is increased by applying a "reverse" voltage. When current passes through, LED 12 emits optical radiation 14.

The first terminal of the LED is connected at the interface of a bottom surface of LED 12 and a first electrode 16. First electrode is bonded to LED 12 by means of a solder or a conductive epoxy 18. Because conductive epoxy 18 is opaque, the light emitted through the bottom surface of LED 12 is blocked.

The second terminal of LED 12 connects to a substrate electrode 22 by a bonding wire 26 that is electrically connected to a pad 24 integrated on a top surface of LED 12. Pad 24 is configured so as to create substantially uniform flow of electricity throughout LED 12 and thus allow the passage of current. Pad 24, however, blocks light 14 emitted from a portion of the top surface of LED 12. An example of an illumination distribution of the emitted light across plane A—A' illustrates the problem as is shown by graph 34 in FIG. 1B.

Further, bonding wire 26 alters the transmission of emitted light 14 from a portion of the top surface of LED 12. Emitted light 14 that is obstructed by the bonding wire 26 along the angle θ will have an altered angular illumination distribution as the bonding wire 26 creates a strong shadow and a non-symmetrical, angular light-emission characteristic. FIG. 1C shows the resulting illumination distribution as curve 30 plotted on the ordinate as the magnitude of the illumination against an angle θ across the surface of LED 12 in comparison with a uniform distribution 32.

Another drawback of using LEDs as light sources is that bonding wire 26 is often coated with a passivation layer 28 that non-uniformly affects emitted light 14. This is a result of the tendency of passivation layer 28 to clump at places along bonding wire 26. Moreover, LEDs that are edge emitters have a different angular light emission characteristic and contribute to a non-uniform irradiance distribution in any optical system in which they are incorporated.

Accordingly it is an object of this invention to provide a light source which minimnizes the effects of electrical contacts on emission.

It is another object of the invention to minimize the effects of edge emitters on an irradiance distribution.

SUMMARY OF THE INVENTION

The aforementioned problems are overcome and other advantages are provided by the invention which provides a light source structured so as to transmit optical radiation having a more uniform irradiance distribution. The light source includes an LED having at least one light-emitting surface substantially free of electrical contacts which would otherwise affect the emission characteristics.

In one embodiment, a first electrode is disposed in the optical path of the emitted light from the LED. The first electrode and a second electrode, disposed on opposite surfaces of the LED, are adapted to receive an applied bias and to cause the LED to emit light from the surface attached to the first electrode. The first electrode is adapted to be substantially optically transparent so as to allow transmission of light without substantially altering its irradiance distribution.

In another embodiment, the second electrode is substantially optically transparent, so that light emitted from the surface of the LED adjacent to it can pass there through first electrode without substantially alteration to the irradiance distribution of the light. The first electrode is attached to the LED by an electrically conductive attachment layer that is interposed between the LED and the first electrode. The attachment layer is electrically conductive and at least partially optically transparent such that the radiation emitted from the LED can be transmitted through the attachment layer and through the first electrode without substantially altering the irradiance distribution of the image-bearing radiation. The attachment layer can contain conductive non-optically transparent particles so as to alter the light irradiance in a substantially uniform manner, but in the preferred embodiment the attachment layer is substantially optically transparent.

Other features of the invention will be readily apparent when the following detailed description is read in connection with the drawings.

BRIEF DESCRIPTION OF THE DRAWINGS

The structure and operation of the invention, together with other objects and advantages thereof, may best be understood by reading the detailed description to follow in connection with the drawings in which.

DESCRIPTION OF THE PREFERRED EMBODIMENTS

While the present invention retains utility with a wide variety of optical devices and may be embodied in several different forms, it is advantageously employed with an optical printer or display device. Though the optical printer is the form of the preferred embodiment, and will be described as such, this embodiment should be considered illustrative and not restrictive. An example of another device in which the invention retains utility is a light source for use in a computer.

Description of the Preferred Embodiments

Figure 1A:
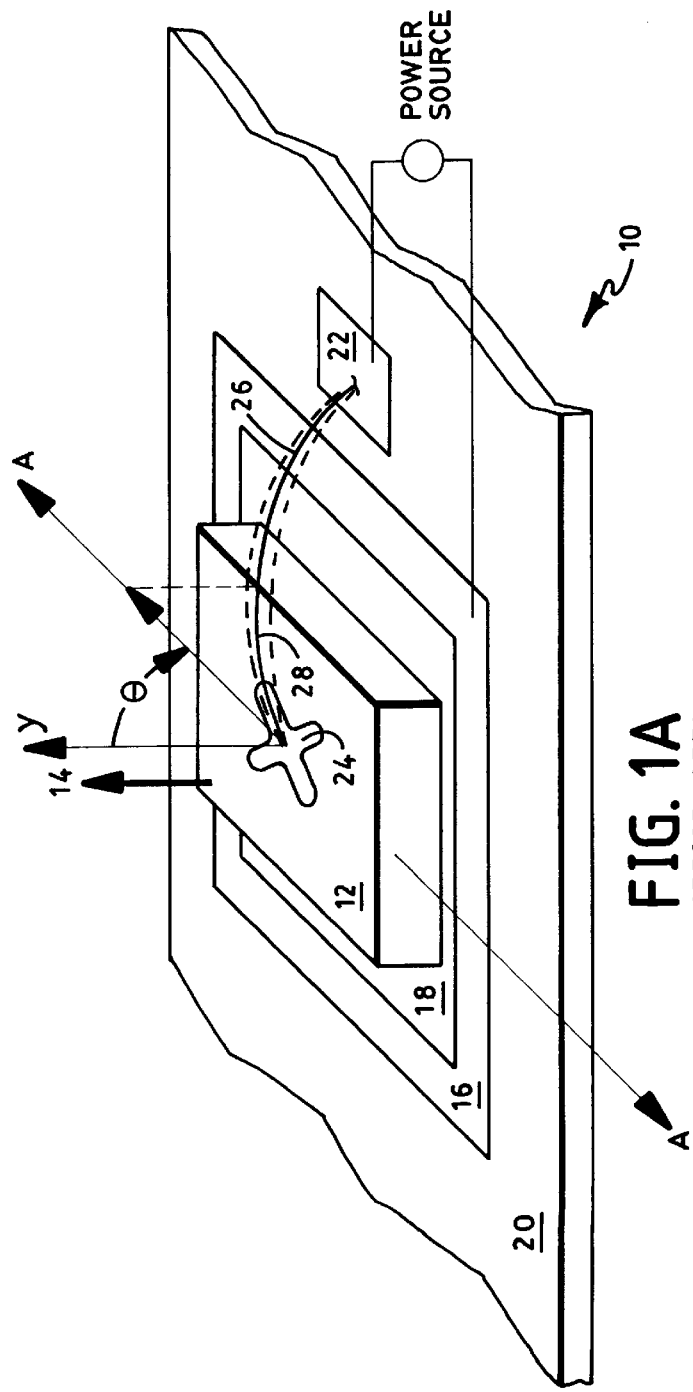
FIG. 1A is perspective view of a prior art LED light source.
Figure 1B:
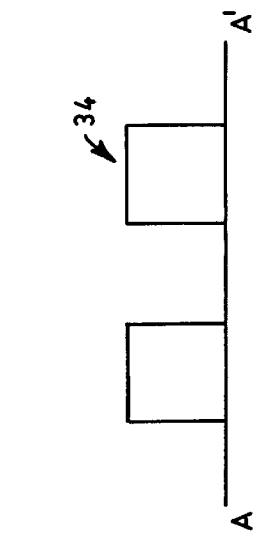
FIG. 1B is a graph of the illumination distribution of the LED light source of FIG. 1A taken across the A—A' plane.
Figure 1C:
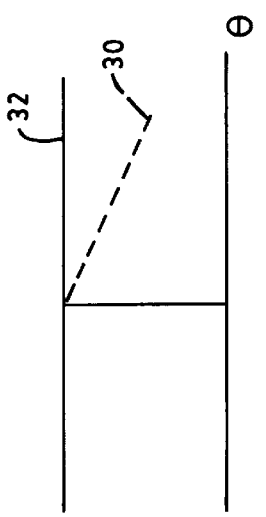
FIG. 1C is a graph of the illumination distribution of the LED light source mapped as a function of θ across the face of the LED light source.
Figure 2:
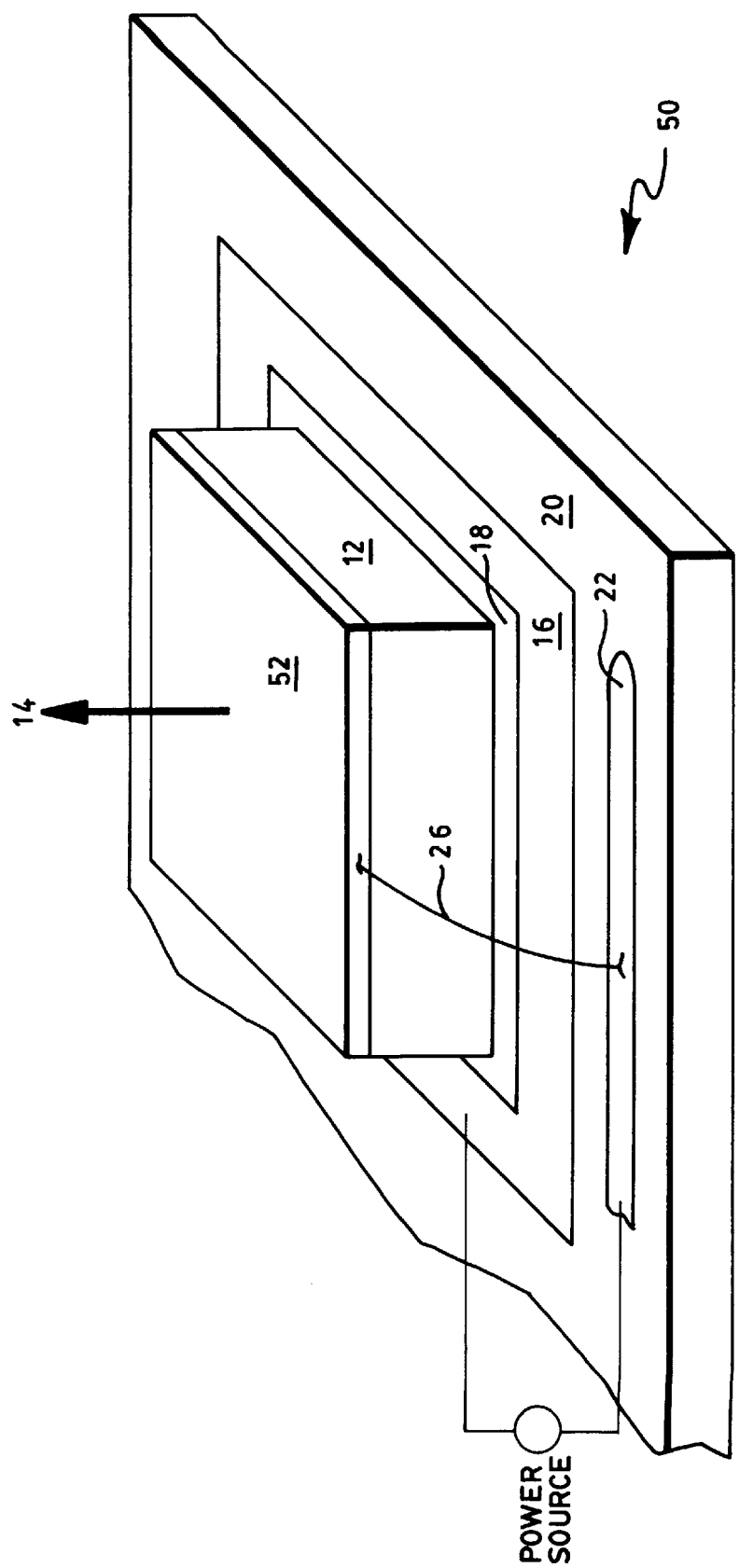
FIG. 2 is a perspective view of a first embodiment of an LED in accordance with the present invention.

There is shown in FIG. 2 (not drawn to scale) a modified light source 50, including a LED, in accordance with one embodiment of this invention, where like numerals designate previously-described elements. LED 12 is typically slab-shaped and interposed between and connected to two electrodes. This electrical communication is established as described earlier by placing a first electrode 16 in electrical communication with LED 12 on the first surface of LED 12. Electrical communication between the second surface of LED 12 and substrate electrode 22 is achieved by using a bonding wire 26 to connect to a second electrode 52, rather than the prior art connecting pad 24 as illustrated in FIG. 1. Second electrode 52 can be configured to extend over only a portion of the top surface of LED 12. It can also be configured to extend beyond the top surface of LED 12 so as to form a lip suitable for attachment of bonding wire 26. As depicted, however, second electrode 52 extends across the top of LED 12 so as to cover the top surface of LED 12 and provide a side surface for the attachment of bonding wire 26 to second electrode 52.

Second electrode 52 is fabricated from an at least partially optically-transparent material so that emitted light 14 can be transmitted through second electrode 52. In the preferred embodiment, second electrode 52 is fabricated from an optically-transparent material that is conductive, such as indium tin oxide for example. A thin conductive layer can also be used even if the material does not have optically-transparent properties but attenuate the light in a uniform manner so as to produce a uniform light irradiance in the colored light 14 to be imaged. Such materials can be attached to LED 12 using epitaxy, oxidation, evaporation, sputtering, vapor deposition or by optically annealing or annealing by heat as well as other methods well known in the art.

Further, it should be apparent that second electrode 52 can comprise an optically-transparent material that is not conductive, such as ultra-violet curable epoxy, but which contains a substantially uniform distribution of conductive particles such as nickel, so as to uniformly effect the light transmission while electrical connecting substrate electrode 22 and LED 12. As such, second electrode 52 can be doped with conductive particles by methods such as diffusion or ion beam implantation, for example.

Figure 3:
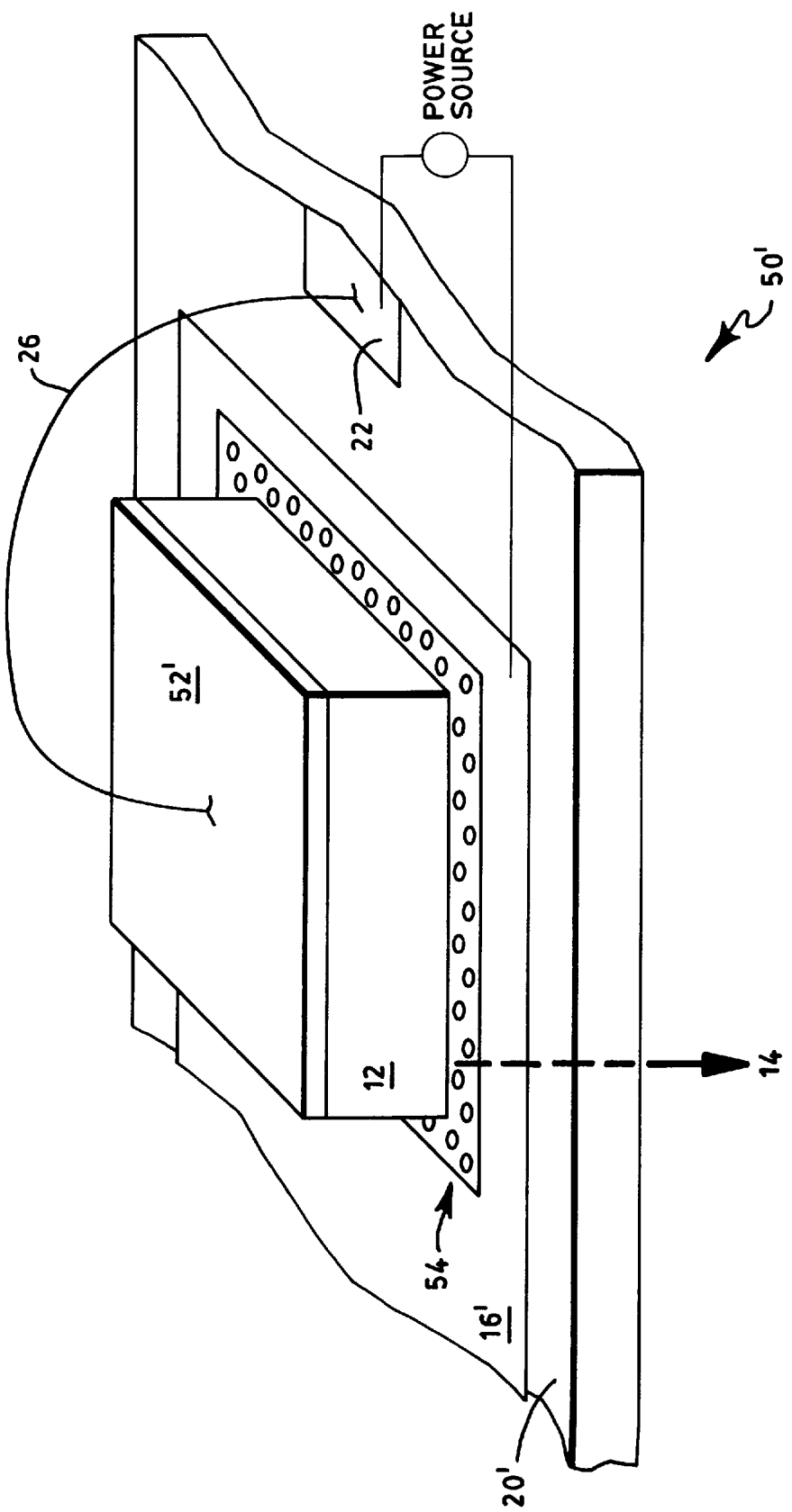
FIG. 3 is a perspective view of a second embodiment of an LED in accordance with the present invention.

Turning now to FIG. 3 where a second embodiment of LED light source 50' is shown, where like numerals designate like elements. In contrast to LED light source 50, LED light source 50' is biased in the opposite direction, thus causing light to be emitted from the surface of LED 12 adjacent to first electrode 16', also called the bottom surface. In the previous embodiment, any light emission from the bottom surface is obstructed by epoxy 18 and first electrode 16. In this embodiment, however, substrate 20', first electrode 16' and an adhesive 54 are fabricated of materials that allow transmission of emitted light 14.

More particularly, LED 12 is bonded to a substantially optically-transparent substrate 20' such as glass or plastic, for example. Substrate 20' is coated with a substantially optically-transparent first electrode 16' such as indium tin oxide. Similarly, adhesive 54 is a substantially optically-transparent layer, such as a transparent conductive epoxy containing conductive particles. Without departing from the scope of this invention, it should be apparent that adhesive 54, substrate 20', and first electrode 16' may have some finite level of light absorption while still functioning within this embodiment of LED light source 50'.

In addition to these optical properties, the material or the combination of materials needs to be capable of attaching first electrode 16' to LED 12 such that it enables LED 12 to receive the applied bias. As such, the adhesive qualities of the material may be present in an epoxy upon drying or after heating, for example. As used herein adhesive shall mean any material or combination of materials having the optical and adhesive properties described in this paragraph. In another embodiment, first electrode 16' having similar adhesive qualities can perform the function of both an adhesive and electrode, thus eliminating adhesive 54 from LED light source 50'.

In another embodiment, adhesive 54 or first electrode 16', singly or alone, can be fabricated by inserting conductive particles 56 into an otherwise non-conductive transparent epoxy, such as ultra-violet curable cement, for example. Conductive particles 56 can be inserted into the adhesive using methods such as diffusion or ion implantation. Conductive particles 56 can be fabricated of many substances, such as a metallic, ceramic, or organic conductors. When using metallic particles however, as they are optically opaque, their presence in adhesive 54 does attenuate the light-transmission and/or absorb portions of emitted light 14. Accordingly, in the preferred embodiment conductive particles 56 are fabricated from a transparent material such indium tin oxide. Thus, LED light source 50' is biased to emit light 14 through the bottom surface of LED 12 that is transmitted through transparent adhesive 54, transparent first electrode 16', and transparent substrate 20' so as to provide a uniform light source.

Figure 4A:
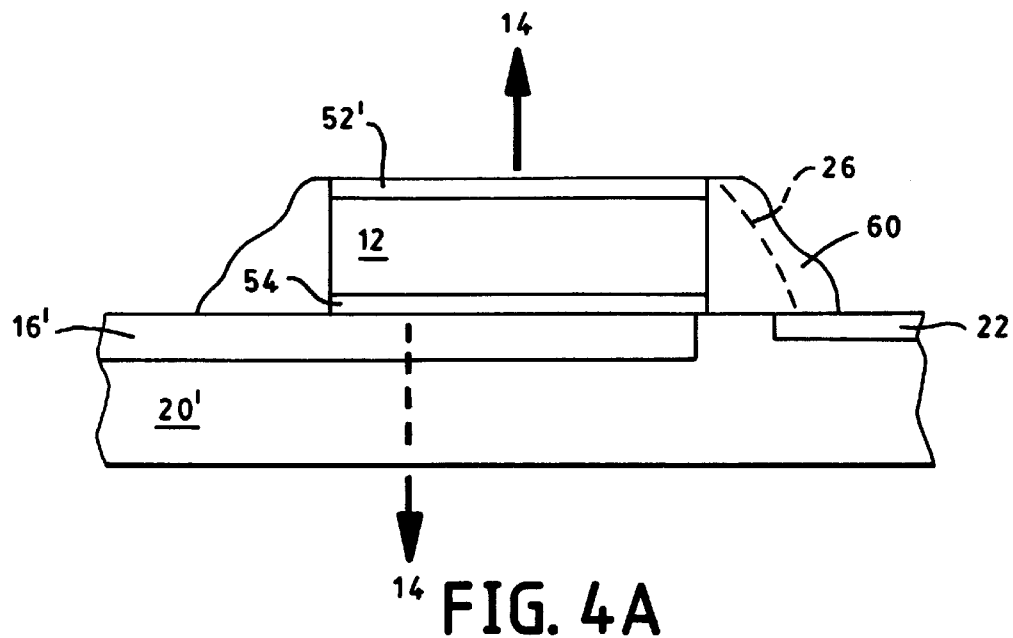
FIG. 4A is a side view of the LED of FIG. 3 having a covering substance surrounding the LED.

Any stray light from the sides of LED 12 can be eliminated or decreased by the embodiment shown in FIG. 4A, where like numerals designate like elements. Non-uniformities in an illumination distribution of an edge emitter are minimized by including a cover material 60 surrounding the sides of LED 12 and second electrode 52'. It should be apparent that cover material 60 does not need to completely surround the edges of second electrode 52' where the second conductor is not optically transparent and light is emitted from the bottom surface of the LED.

Figure 4B:
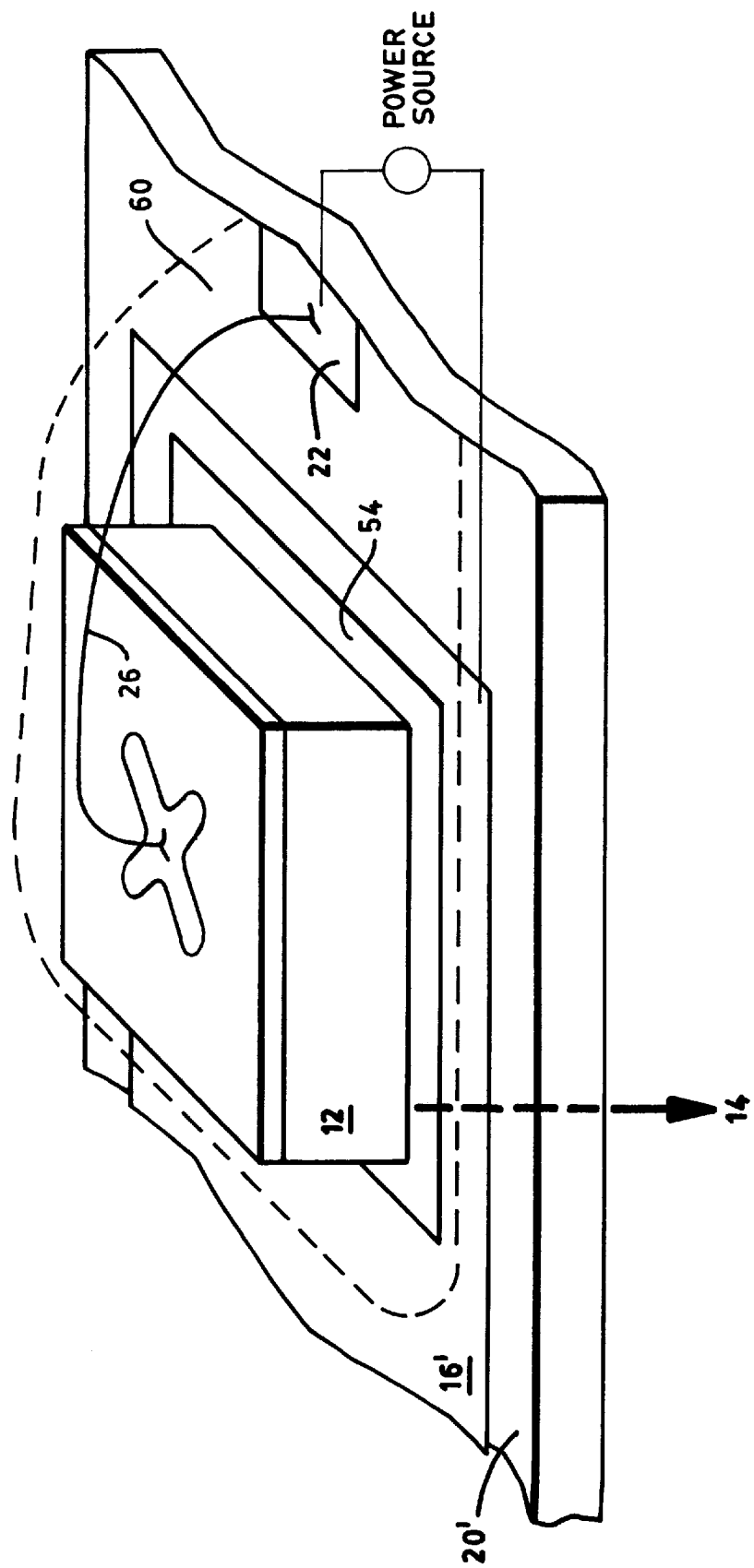
FIG. 4B is a perspective view of a covering substance surrounding an LED.

Cover material 60 is preferably an optically opaque epoxy or potting compound, although other substances that are optically opaque can be used without departing from the scope of the invention. Other substances that may surround LED 12 include plastic or rubbers which have optically opaque or substantially optically opaque properties. Not only can cover material 60 be used to diminish the effects of edge emitters, cover material 60 can also be used to protect the light source from environmental and industrial hazards, such as vibration and condensation, for example. Such protection is achieved by disposing covering material 60 around bonding wire 26 and the connection to substrate electrode 22 as well as the top surface and the sides of LED 12, as it is shown more clearly in FIG. 4B, where like numerals designate like elements.

Figure 5A:
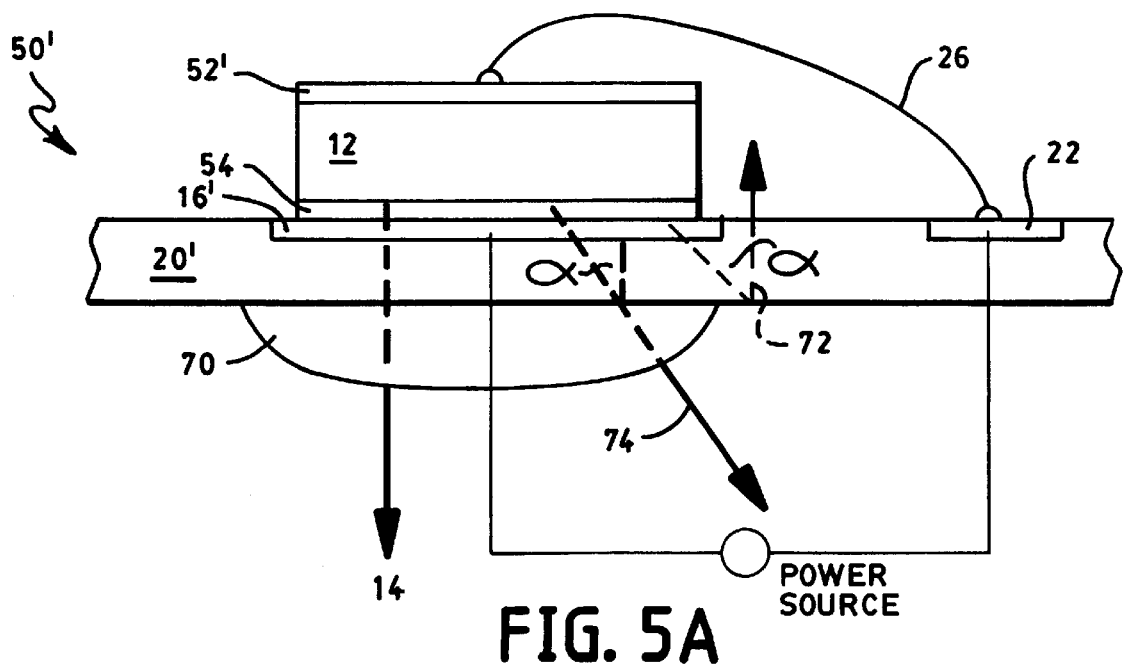
FIG. 5A is a side view of the LED of FIG. 3 with an optical element in the path of emission of the LED.

An additional advantage to using the LED light source of FIG. 3, is that the bottom surface of the substrate provides a surface upon which other optical elements can be coupled to the light source and thus easily manipulate the illumination. In FIG. 5A, where like numerals designate like elements, the transmission of the emitted light can be enhanced by coupling an optical element 70 to the bottom of the substrate. More particularly, the emitted light from LED 12 is diverging light that has to be transmitted through multiple interfaces, including the interface of the substrate and the air. At each such interface, the light will be refracted and emitted light 14 that impinges upon the interface at an angle greater than a critical angle of the interface will be reflected. The critical angle is determined according to Snell's Law, as is well known in the art, and is a function of the refractive indexes of the two materials at the interface as well as the angle of incidence of the light upon the interface.

The refracted light will be changed in direction by an angle determined by Snell's Law also as is well known in the art. By the time emitted light 14 impinges upon the interface between substrate 20' and the air, it will have been refracted by the previous interfaces. As such, emitted light 14 may be at an angle that exceeds the critical angle of the substrate-air interface. As illustrated, if angle α is greater than the critical angle of the substrate-air interface, light ray 72 is reflected.

In this embodiment, however, optical element 70 will permit transmission of a light ray 74 impinging upon a substrate-optical element interface at the same angle α. Optical element 70 can be a convex lens or other well known devices that assist in transmission of otherwise trapped light rays such as a rough surface, for example. The materials of LED light source 50' are also chosen to decrease the amount of this internal reflection.

Figure 5B:
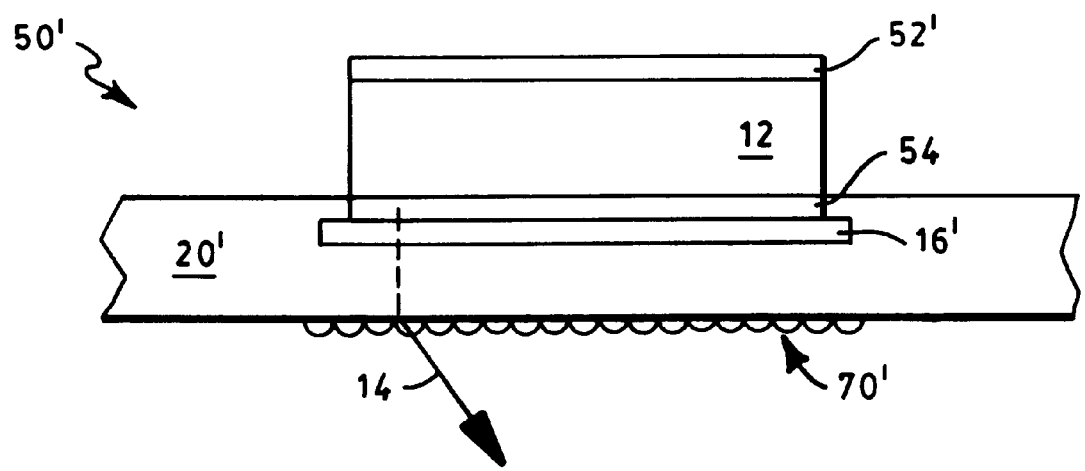
FIG. 5B is a side view of the LED of FIG. 3 with an alternate optical element.

FIG. 5B, where like numerals designated like elements, shows a different optical element 70' attached to the bottom surface of substrate 20' where the alternative optical element is a Frensel lens. In contrast to a convex lens the Frensel lens will produce a LED light source 50' with a smaller profile and will offer advantages where the size of the light source is constrained by specifications.

Figure 5C:
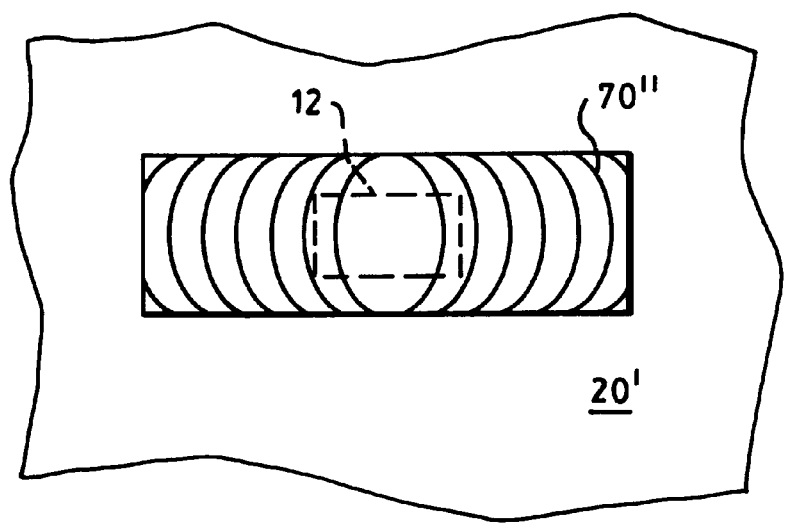
FIG. 5C is a bottom view of the LED of FIG. 3 coupled to an optical element.

A Frensel lens or any series of regular or irregular shapes can be used not only to enhance the efficiency of light transmission from LED light source 50', but also to deflect emitted light 14 in a predetermined pattern. An example of use of this lens would be when the light source is required to have smaller dimensions while emitting over a larger surface area. For example, a series of prisms patterned as a rectangular could refract the emitted light so to produce an image of a rectangular light source that has larger dimensions than LED 12. The projection of a light source with dimensions greater than LED 12 can also be achieved by manufacturing a holographic optical elements 70", as is shown in FIG. 5C, directly upon substrate 20'. It should be apparent that holographic optical elements, or other optical elements can also be attached to LED light source 50' in this manner.

Figure 6A:
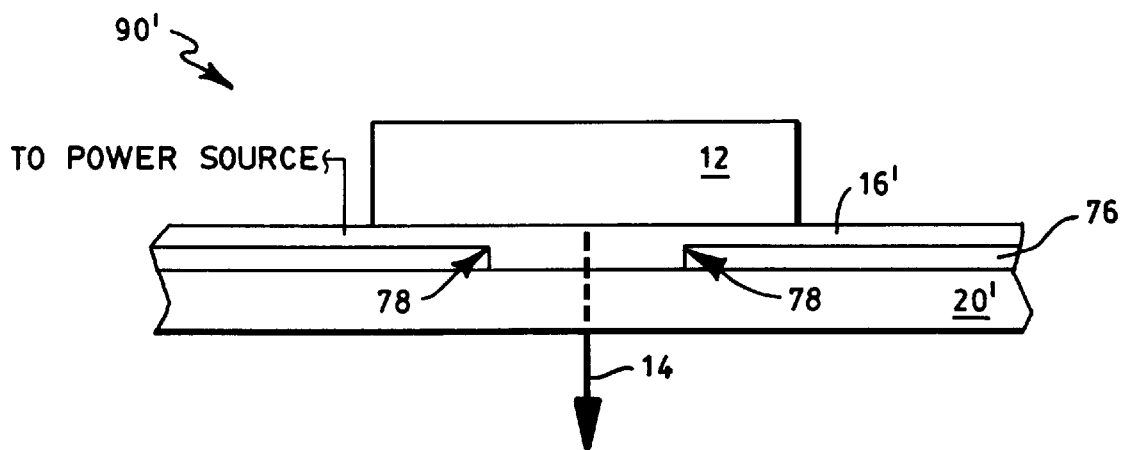
FIG. 6A is a side view of an LED light source coupled to an optical element to decrease an area of image-bearing light focused by an optical system.

Not only does the bottom surface of the substrate 20' lend itself to coupling with an optical element to increase efficiency, enlarge or scatter emitted light 14, it also provides a surface for depositing a mask layer, as more fully shown in FIG. 6A, where like numerals designate like elements. A mask layer 76 can be positioned more precisely than LEDs 12. As such, in applications that require smaller tolerances for LED light source 90', mask layer 76 having edges 78 defined to meet such specifications allows and LED light source 50' to be used instead of an otherwise more complex or expensive optical system.

Figure 6B:
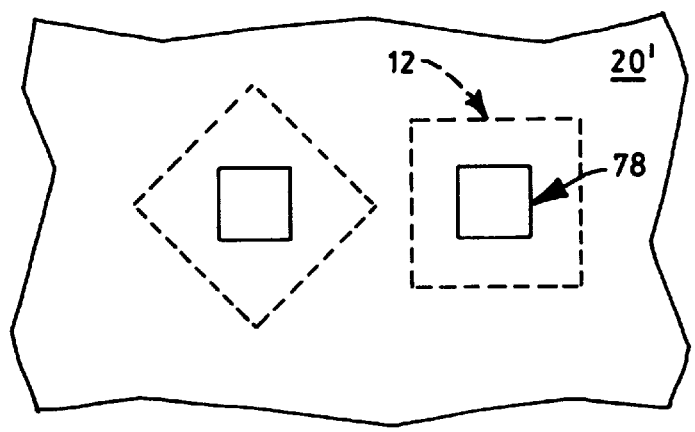
FIG. 6B is a further embodiment showing a bottom view of two LED light sources.

Mask layer 76 can be deposited by pattern generation, etching or other chemical or photographic means as are well known in the art to within 0.5 microns using current technology. In applications where the placement of LEDs 12 is limited by machinery that positions the LEDs during manufacturing, mask layer 76 is also useful. An example, of such an application is illustrated in FIG. 6B which shows a bottom view of substrate 20' and edges 78 of mask layer 76 overlying two LEDs 12. Mask layer can also shape emitted light 14 into any form such as a circle, word, among other items, for use in displays or patterned applications.

In the preferred embodiment, mask layer 76 is disposed between first electrode 16' and substrate 20' so as to be close to emitted light 14. It should be apparent, however, that mask layer 76 can be disposed upon the opposing surface of the substrate without departing from the scope of the invention.

While the invention has been described with reference to particular embodiments, it will be understood that the present invention is by no means limited to the particular constructions and methods herein disclosed and/or shown in the drawings, but also comprises any modifications or equivalents within the scope of the claims.

What is claimed is:

1. A light source adapted to emit radiation in the presence of an applied current, said light source comprising:

an LED for emitting radiation;

a substantially optically transparent electrode in electrical communication and in optical communication with said LED disposed on said LED in the optical path of the radiation emitted from said LED, said substantially optically transparent electrode allowing the transmission of a portion of light there through;

a second electrode in electrical communication with said LED, said second electrode being disposed on opposed surface of said LED than said substantially optically transparent electrode;

an electrically conductive attachment layer interposed between said substantially optically transparent electrode and a surface of said LED adapted to transmit radiation such that at least a portion of the radiation emitted from said LED passes through said electrically conductive attachment layer;

a substrate upon which said substantially optically transparent electrode is disposed, attached to an opposite surface of said substantially optically transparent electrode than said LED at least a portion of said substrate being optically transparent such that the light emitted from said LED is transmitted through said substrate; and a power source in electrical communication with said substantially optically transparent electrode and said second electrode so as to generate the applied current across said LED thus causing said LED to emit radiation, at least a portion of the radiation being transmitted through said substantially optically transparent electrode and producing a substantially uniform irradiance distribution.

2. A light source according to claim 1 further comprising an opaque substance surrounding at least a portion of said LED, thus decreasing transmission of light from said LED.

3. A light source according to claim 2 wherein said opaque substance is a potting compound.

4. A light source according to claim 2 wherein said opaque substance is an epoxy.

5. A light source according to claim 1 further comprising:
   a bonding contact connecting said substantially optically transparent electrode to the power source; and
   an opaque substance disposed surrounding said bonding contact and at least a portion of said LED thus decreasing detrimental environmental hazardous to electrical communication between said second electrode and said LED.

6. A light source according to claim 1 further comprising an optical element in optical communication with said substrate and attached to an opposed side of said substrate than said LED adapted to transmit light from said substrate that impinges said substrate at an angle substantially beyond the critical angle thus increasing the transmission of light.

7. A light source according to claim 6 wherein said optical element is a convex lens device.

8. A light source according to claim 1 further comprising an optical element in optical communication with said substrate and attached to an opposed side of said substrate than said LED adapted to transmit light from said substrate to said optical element in a shaped pattern.

9. A light source according to claim 8 wherein said optical element is a Frensel lens device.

10. A light source according to claim 8 wherein said optical element covers a portion of said substrate.

11. A light source according to claim 8 wherein said optical element is concentric prisms that produce a light source image larger than said LED.

12. A light source according to claim 8 wherein said optical element is a holographic optical device.

13. A light source according to claim 8 wherein said optical element is in combination a holographic optical device and a Frensel lens interposed between said holographic optical device and said substrate.

14. A light source according to claim 1 further comprising a mask disposed upon said substrate adapted to impede transmission of a portion of the light.

15. A light source according to claim 14 wherein said mask is interposed between said substrate and said substantially optically transparent electrode.

16. A light source according to claim 14 wherein said mask is shaped.

17. A light source according to claim 14 wherein a portion of said mask defines an aperture, which is shaped smaller than said LED, such that the transmission of light from said LED is determined in part by the positioning of said mask.

18. A light source adapted to emit radiation in the presence of an applied current, said light source comprising:
   an LED for emitting radiation;
   a substantially optically transparent electrode in electrical communication and in optical communication with said LED disposed on said LED in the optical path of the radiation emitted from said LED, said substantially optically transparent electrode allowing the transmission of a portion of light there through;
   a second electrode in electrical communication with said LED, said second electrode being disposed on opposed surface of said LED than said substantially optically transparent electrode;
   an electrically conductive attachment layer interposed between said substantially optically transparent electrode and a surface of said LED adapted to transmit radiation such that at least a portion of the radiation emitted from said LED passes through said electrically conductive attachment layer;
   a power source in electrical communication with said substantially optically transparent electrode and said second electrode so as to generate the applied current across said LED thus causing said LED to emit radiation at least a portion of the radiation being transmitted through said substantially optically transparent electrode and producing a substantially uniform irradiance distribution;
   a mask attached to a surface of said substantially optically transparent electrode on opposed side of said substantially optically transparent electrode than said LED such that said mask is layered over a portion of said substantially optically transparent electrode adapted to impede the transmission of light there through; and
   a substrate upon which said mask and a portion of said substantially optically transparent electrode are disposed, at least a portion of said substrate being optically transparent such that the light emitted from said LED is transmitted through said substrate.

19. A light source adapted to emit radiation in the presence of an applied current, said light source comprising:
   an LED for emitting radiation;
   a substantially optically transparent electrode in electrical communication and in optical communication with said LED disposed on said LED in the optical path of the radiation emitted from said LED, said substantially optically transparent electrode allowing the transmission of a portion of light there through;
   a second electrode in electrical communication with said LED, said second electrode being disposed on opposed surface of said LED than said substantially optically transparent electrode;
   an electrically conductive attachment layer interposed between said substantially optically transparent electrode and a surface of said LED adapted to transmit radiation such that at least a portion of the radiation emitted from said LED passes through said electrically conductive attachment layer;
   a substrate upon which said electrically conductive attachment layer is disposed, attached to an opposed surface of said electrically conductive attachment layer than said LED, said substrate adapted to transmit there through at least a portion of the radiation emitted from said LED; and
   a power source in electrical communication with said substantially optically transparent electrode and said second electrode so as to generate the applied current across said LED thus causing said LED to emit radiation, at least a portion of the radiation being transmitted through said substantially optically transparent electrode and producing a substantially uniform irradiance distribution.

20. A light source according to claim 19 further comprising:
   a bonding contact connecting said substantially optically transparent electrode to the power source; and
   an opaque substance disposed surrounding said bonding contact and at least a portion of said LED thus decreasing detrimental environmental hazardous to electrical communication between said second electrode and said LED.

21. A light source according to claim 19 farther comprising an opaque substance surrounding at least a portion of said LED, thus decreasing transmission of light from said LED.

22. A light source according to claim 21 wherein said opaque substance is a potting compound.

23. A light source according to claim 21 wherein said opaque substance is an epoxy.

* * * * *